US007091543B2

(12) United States Patent
Tzeng et al.

(10) Patent No.: US 7,091,543 B2
(45) Date of Patent: Aug. 15, 2006

(54) EMBEDDED DUAL-PORT DRAM PROCESS

(75) Inventors: Kuo-Chyuan Tzeng, Hsin-Chu (TW); Ming-Hsiang Chiang, Taipei (TW); Wen-Chuan Chiang, Hsin-Chu (TW); Dennis J. Sinitsky, Sunnyvale, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/920,492

(22) Filed: Aug. 18, 2004

(65) Prior Publication Data

US 2005/0017285 A1 Jan. 27, 2005

Related U.S. Application Data

(62) Division of application No. 10/438,646, filed on May 15, 2003, now Pat. No. 6,794,254.

(51) Int. Cl.
*H01L 27/108* (2006.01)
(52) U.S. Cl. ................ 257/301; 257/296; 257/E27.084
(58) Field of Classification Search .................. 257/68, 257/71, 296, 301, E27.084–E27.097, E27.075; 438/243, 386
See application file for complete search history.

(56) References Cited

U.S. PATENT DOCUMENTS

| 5,249,165 | A | | 9/1993 | Toda ...................... 365/189.04 |
|---|---|---|---|---|
| 5,327,375 | A | | 7/1994 | Harari ......................... 365/149 |
| 5,389,558 | A | * | 2/1995 | Suwanai et al. ............. 438/241 |
| 5,624,863 | A | * | 4/1997 | Helm et al. .................. 438/210 |
| 5,780,336 | A | * | 7/1998 | Son ............................. 438/251 |
| 5,811,347 | A | | 9/1998 | Gardner et al. ............. 438/435 |
| 5,969,395 | A | * | 10/1999 | Lee ............................. 257/408 |
| 5,981,324 | A | * | 11/1999 | Seo et al. .................... 438/210 |
| 6,218,693 | B1 | * | 4/2001 | Lu .............................. 257/296 |
| 6,323,106 | B1 | | 11/2001 | Huang et al. ............... 438/433 |
| 6,815,281 | B1 | * | 11/2004 | Inoue et al. ................. 438/200 |
| 6,897,504 | B1 | * | 5/2005 | Yaung et al. ................ 257/296 |
| 2003/0082888 | A1 | | 5/2003 | Lin .............................. 438/424 |

OTHER PUBLICATIONS

"An 8-ns Random Cycle Embedded RAM Macro with Dual-Port INterleaved DRAM Architecture (D²RAM)" Agata et al.; IEEE Journal of Solid State Circuits, vol. 35, No. 11, Nov. 2000, pp. 1668-1672.

* cited by examiner

*Primary Examiner*—Eugene Lee
(74) *Attorney, Agent, or Firm*—Thomas, Kayden, Horstemeyer & Risley

(57) ABSTRACT

A new method to form DRAM cells in an integrated circuit device is achieved. The method comprises providing a substrate. A plurality of STI regions is formed in the substrate. The STI regions comprise trenches in the substrate. The trenches are filled with a first dielectric layer. All of the first dielectric layer is etched away from a first group of the STI regions to form open trenches while leaving the first dielectric layer in a second group of the STI regions. A second dielectric layer is formed overlying the substrate and lining the open trenches. A conductive layer is deposited overlying the second dielectric layer and completely filling the open trenches. The conductive layer is patterned to define DRAM transistor gates and to define DRAM capacitor top plates. Thereafter, ions are implanted into the substrate to form source and drain regions for the transistors.

9 Claims, 11 Drawing Sheets

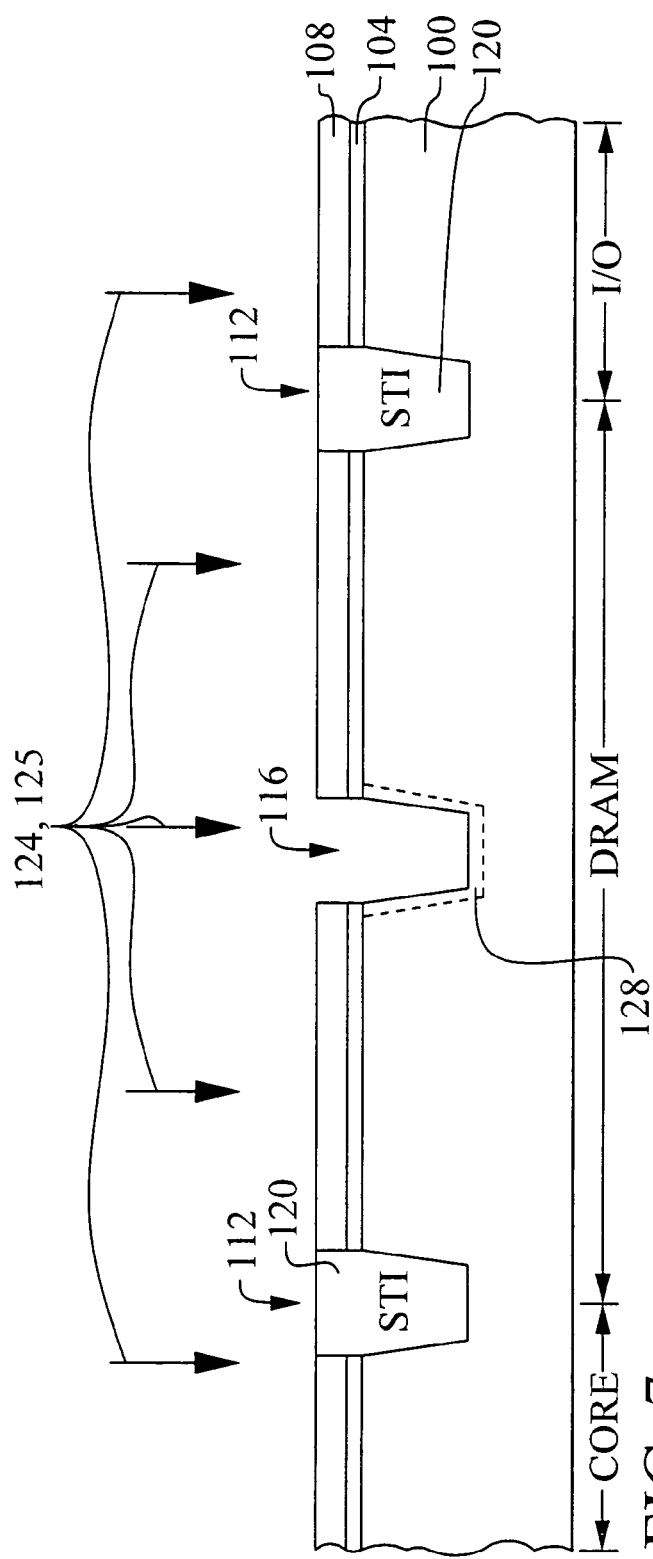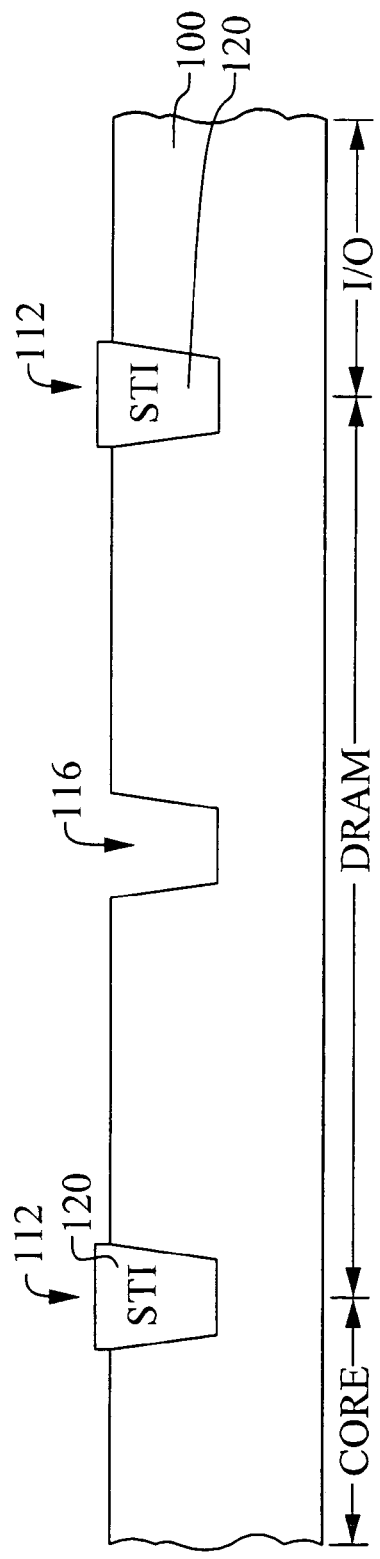

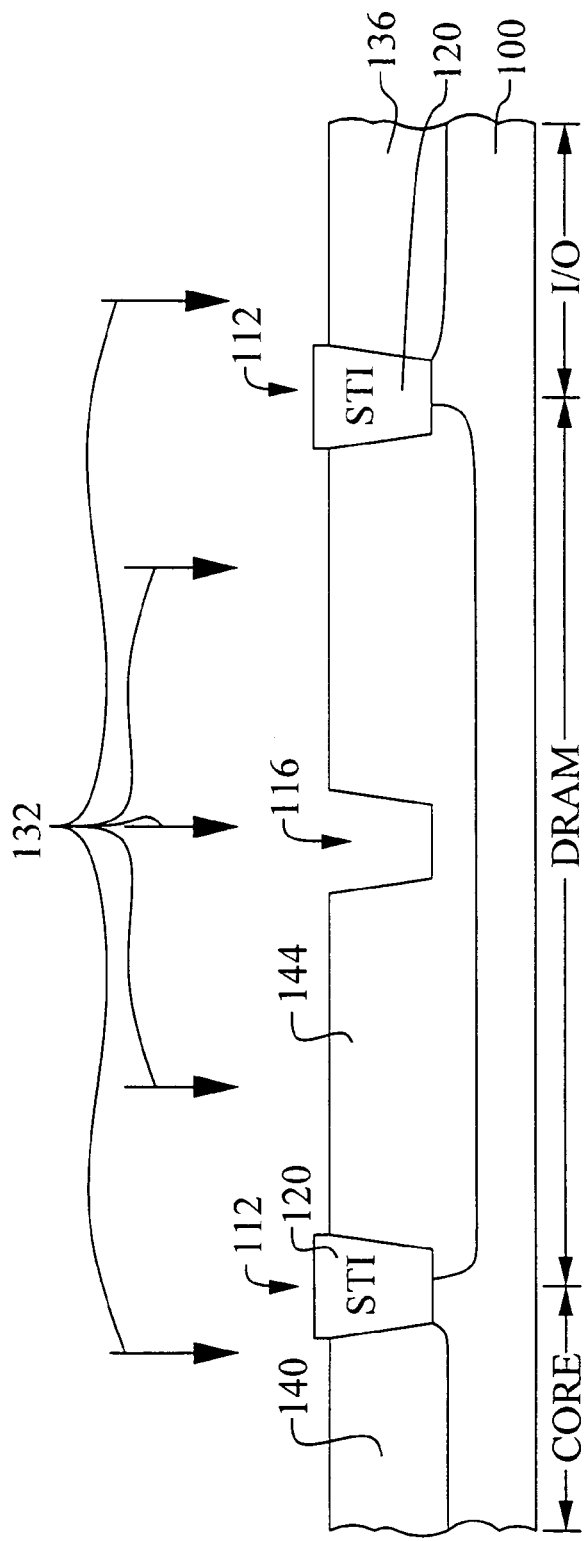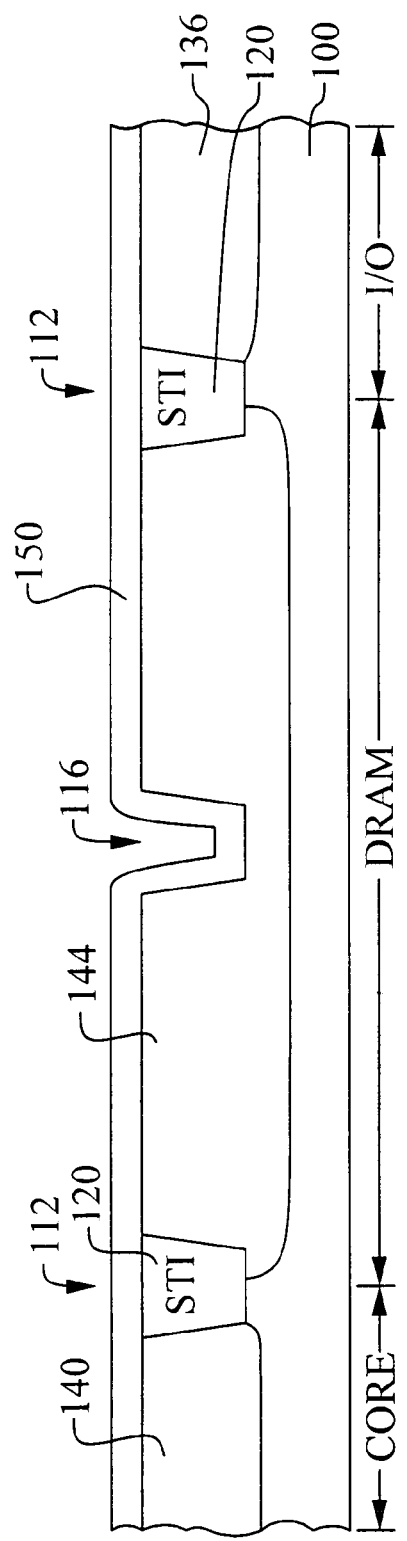

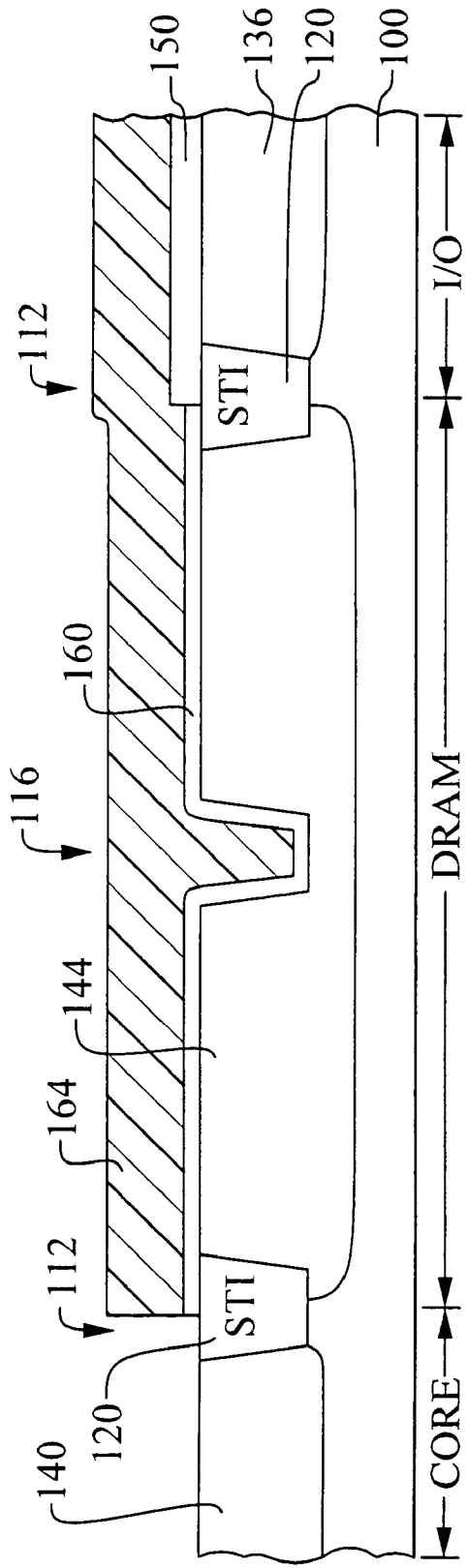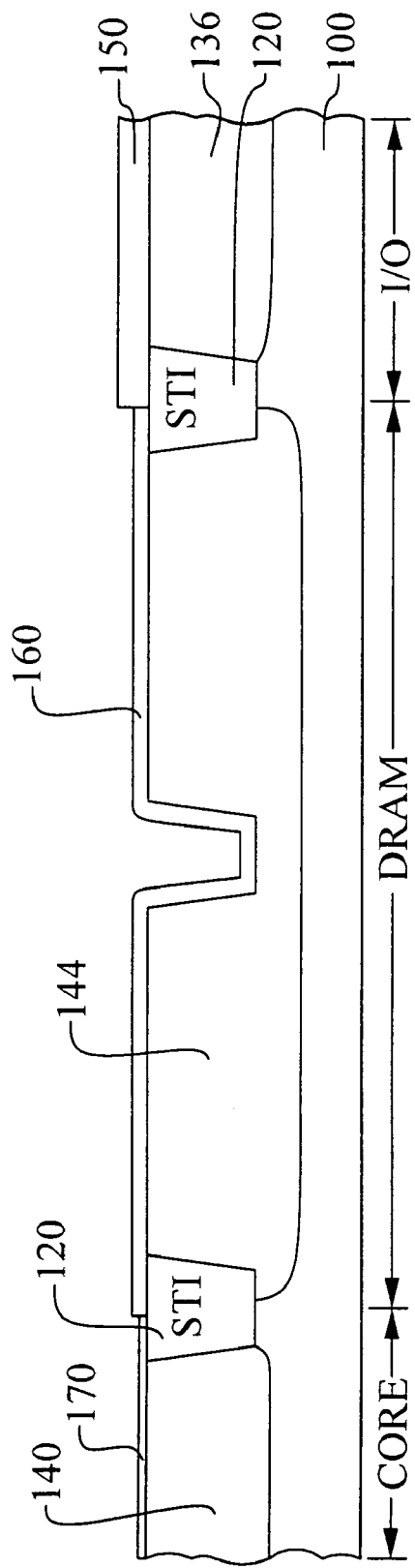

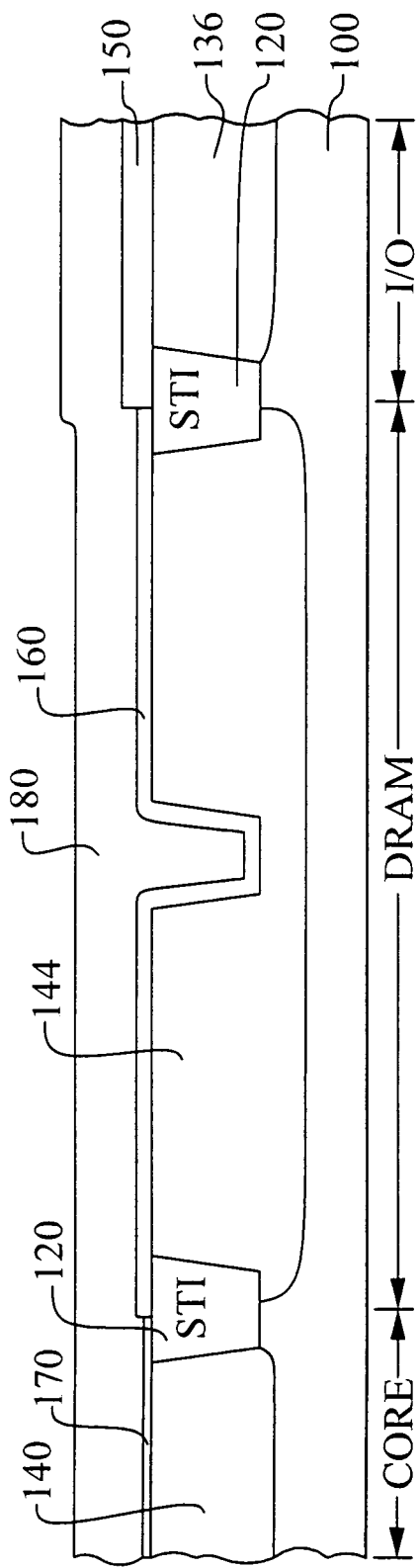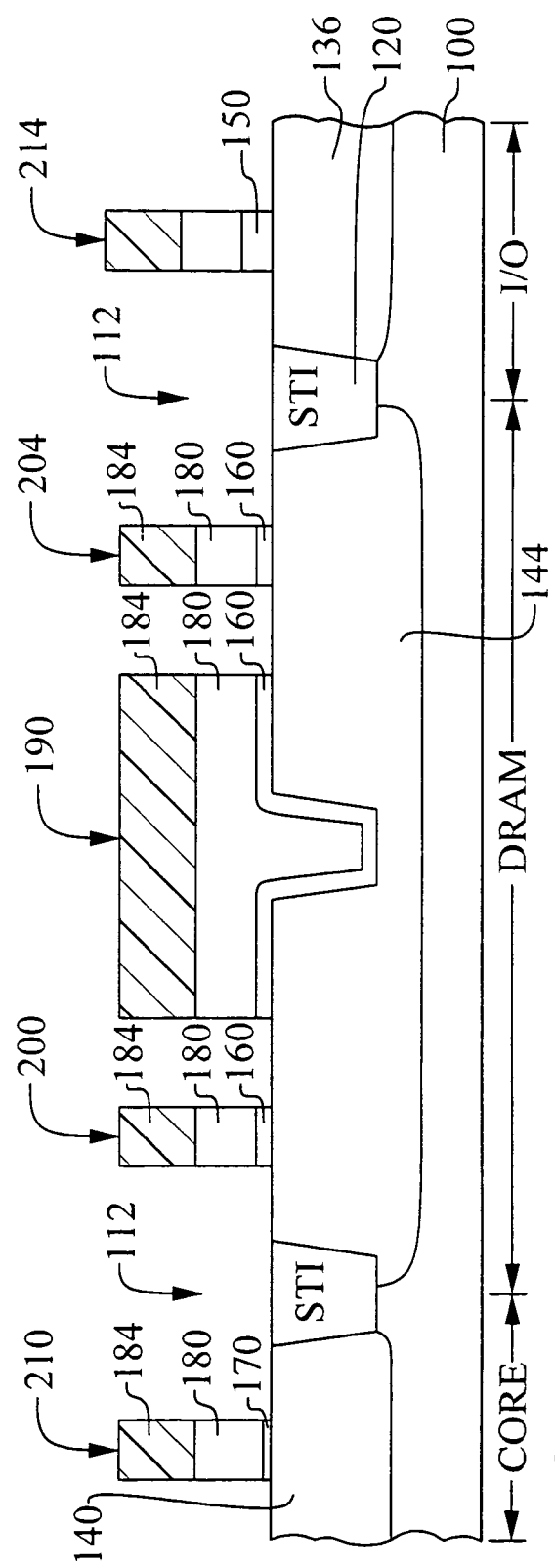

EMBEDDED DUAL-PORT DRAM PROCESS

This application is a divisional of 10/438,646 May 15, 2003 U.S. Pat. No. 6,794,254.

BACKGROUND OF THE INVENTION (1) Field of the Invention

The invention relates to an integrated circuit memory device, and, more particularly, to a method to form dual-port DRAM cells in an integrated circuit device.

(2) Description of the Prior Art

Modern multimedia applications and personal computers require large RAM memory systems with high throughput rates. In particular, three-dimensional graphics rendering and networking applications demand a combination of fast random access cycle times, low latency, and large memory sizes.

Referring now to FIG. 1, a plot is shown of typical RAM capacities (bits) versus random access cycle frequency (Hz). It is found that the largest capacities can be formed in dynamic RAM (DRAM) technologies 10. However, these DRAM technologies are limited in their random access operating speed to the 10 MHz to 100 MHz range. It is also found that the fastest random cycle speeds are achieved using static RAM (SRAM) technology 18. However, the relatively large cell size of SRAM limits the capacity to about 1 Mbit. Further, it is found that a large number of applications 14, such as multimedia and networking, would be optimally served by a technology having an operating speed greater than DRAM 10 and a size greater than SRAM 18. The teachings of the present invention are directed to filling this niche, especially for system on chip (SOC) architectures.

Referring now to FIG. 2, a typical DRAM cell construction is shown. A typical DRAM cell comprises a storage capacitor 26 and an access transistor 22. Most prior art DRAM cells use a MOS transistor 22 as the access device. Many variations on storage capacitors 26 have been described in the art. The source of the access transistor 22 is coupled to the storage capacitor 26. The drain of the access transistor 22 is coupled to a bit line (BL) 34. The gate of the access transistor 22 is coupled to a word line (WL) 30. The voltage, or charge, state of the storage capacitor 26 determines the memory state of the cell. The access transistor 22 is turned ON or OFF by the WL 30 voltage. To write data to the cell, the WL signal 30 is asserted to turn ON the access transistor 22. The voltage on the BL signal is then coupled to the capacitor 26. To read the cell, the access transistor 22 is again turned ON by the WL signal 30. Charge on the capacitor 26 is then coupled onto the BL 34. A sense amplifier on the BL 34 is used to determine the capacitor voltage and, thereby, the memory value (0 or 1). In addition, the capacitor 26 must be refreshed periodically to compensate for current leakage. A refresh cycle performs a READ of the cell and then a WRITE of the cell to refresh the charge state of the capacitor.

The timing performance of this typical DRAM cell is shown. The BL signal 34 performs in one of two states, ACTIVE and PRECHARGE. During the ACTIVE state, the BL signal 34 is either forcing the WRITE voltage (high or low) to the cell or is conducting the READ charge from the cell. During the PRECHARGE state, the BL signal 34 is forced to a mid-level (between low and high) voltage that is most conducive to low leakage current and to rapid WRITE/READ access. The BL signal 34 transitions from the PRECHARGE state to the ACTIVE state in response to commands (CMD) such as READ or WRITE or REFRESH that are issued by the DRAM control logic. The access cycle time is shown as the time between consecutive accesses to the DRAM cell.

Referring now to FIG. 3, another prior art DRAM cell is shown. In this cell, two access transistors 40 and 44 are used to control access to a single storage capacitor 48. This configuration is called dual-port DRAM. The dual-port DRAM uses a first WL signal, WLa 60, to control coupling of a first BL signal, BLa 52, to the capacitor 48 via a first transistor 40. A second WL signal, WLb 64, is used to control coupling of a second BL signal, BLb 56, to the capacitor 48 via a second transistor 44. The key advantage of the dual-port DRAM cell is increased speed.

The timing diagram shows that the two access BL signals, BLa 52 and BLb 56, work somewhat independently. When BLa is in the ACTIVE state in response to a CMD, BLb can be in PRECHARGE and visa versa. As a result, it is possible to access the storage capacitor 48 at twice the rate of the single-port DRAM cell of FIG. 2. While the access rate of the dual-port DRAM is doubled, the cell area is not doubled. The largest element in a DRAM cell is the storage capacitor. While the dual-port DRAM doubles the number of access transistors 40 and 44, it only requires a single storage capacitor 48. Because of the improved performance, the dual-port DRAM can offer significant advantages in the multimedia and networking regime of operation 14 described in FIG. 3. In addition, it is found that significant cost advantages can be achieved by integrating dual-port DRAM memory onto multimedia or networking chips in SOC architectures. To facilitate this multiple technology up-integration, the ability to form high performance logic, I/O, and dual-port DRAM onto a single integrated circuit device is necessary. The integration of these technologies is the focus of the present invention.

Several prior art inventions relate to DRAM cells and to shallow trench isolation structures. U.S. Pat. No. 5,249,165 to Toda describes a multiple port memory device. U.S. Pat. No. 5,811,347 to Gardner et al teaches a method to form shallow trench isolation (STI). Nitrogen is incorporated into the trench liner oxide to thereby improve performance and reduce active area loss. U.S. Pat. No. 6,323,106 B1 to Huang et al describes a method to form STI regions. A liner oxide is formed in the trenches. A tilted angle, ion implantation of nitrogen is performed to form an oxynitride layer in the liner oxide of the trench sidewalls. U.S. Pat. No. 5,327,375 to Harari discloses a DRAM cell with a sidewall storage capacitor. Multiple port DRAM cells and trench capacitors are disclosed. Agata et al, in "An 8-ns Random Cycle Embedded RAM Macro With Dual-Port Interleaved DRAM Architecture ($D^2RAM$), IEEE Journal of Solid-State Circuits, Vol. 35, No. 11, November 2000, pp. 1668–1672, discloses a dual-port DRAM device with cells comprising one capacitor and two access transistors. Folded bitline architecture is described.

SUMMARY OF THE INVENTION

A principal object of the present invention is to provide an effective and very manufacturable method to form dual-port DRAM in an integrated circuit device.

A further object of the present invention is to provide a method to form dual-port DRAM in a standard CMOS process while making minimal changes to that process.

A yet further object of the present invention is to provide a method to form dual-port DRAM cells having minimal cell area and optimal access speed.

A yet further object of the present invention is to provide a method to form dual-port DRAM using available shallow trench isolation (STI) trenches to form trench capacitors.

A yet further object of the present invention is to provide a dual-port DRAM cell having a small layout area and excellent performance.

A yet further object of the present invention is to provide dual-port DRAM capability in a system on chip (SOC) integrated circuit device.

In accordance with the objects of this invention, a method to form DRAM cells in an integrated circuit device is achieved. The method comprises providing a substrate. A plurality of STI regions is formed in the substrate. The STI regions comprise trenches in the substrate. The trenches are filled with a first dielectric layer. All of the first dielectric layer is etched away from a first group of the STI regions to form open trenches while leaving the first dielectric layer in a second group of the STI regions. A second dielectric layer is formed overlying the substrate and lining the open trenches. A conductive layer is deposited overlying the oxide layer and completely filling the open trenches. The conductive layer is patterned to define DRAM transistor gates and to define DRAM capacitor top plates. Thereafter, ions are implanted into the substrate to form source and drain regions for the transistors.

Also in accordance with the objects of this invention, an integrated circuit device is achieved. The device comprises a plurality of MOS devices. A plurality of STI regions in a substrate separates the MOS devices. An array of DRAM cells each comprises a capacitor comprising a trench in the substrate. The trench is lined by a dielectric layer. The trench is filled by a conductive layer overlying the dielectric layer. The trench is etched at the same time as trenches for the STI regions. Access transistors having gate, drain, and source terminals are included. The gate terminals comprise the polysilicon layer.

BRIEF DESCRIPTION OF THE DRAWINGS

In the accompanying drawings forming a material part of this description, there is shown:

FIGS. 4 through 19 illustrate a preferred embodiment of the present invention showing a method to form dual port, DRAM cells in an integrated circuit device.

DESCRIPTION OF THE PREFERRED EMBODIMENTS

The preferred embodiments of the present invention disclose a method to form dual-port DRAM cells. The method integrates a unique dual-port DRAM fabrication into a standard CMOS process. It should be clear to those experienced in the art that the present invention can be applied and extended without deviating from the scope of the present invention.

Figure 1:
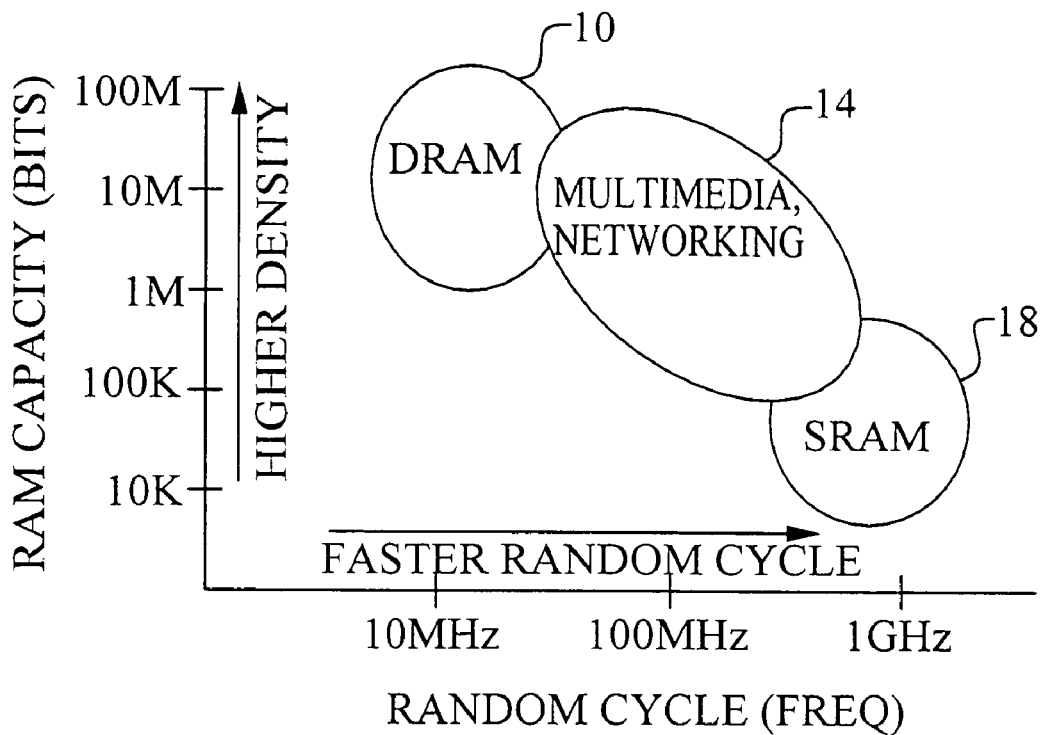
FIG. 1 illustrates the relationship between RAM capacity and random access frequency for different types of RAM devices.
Figure 2:
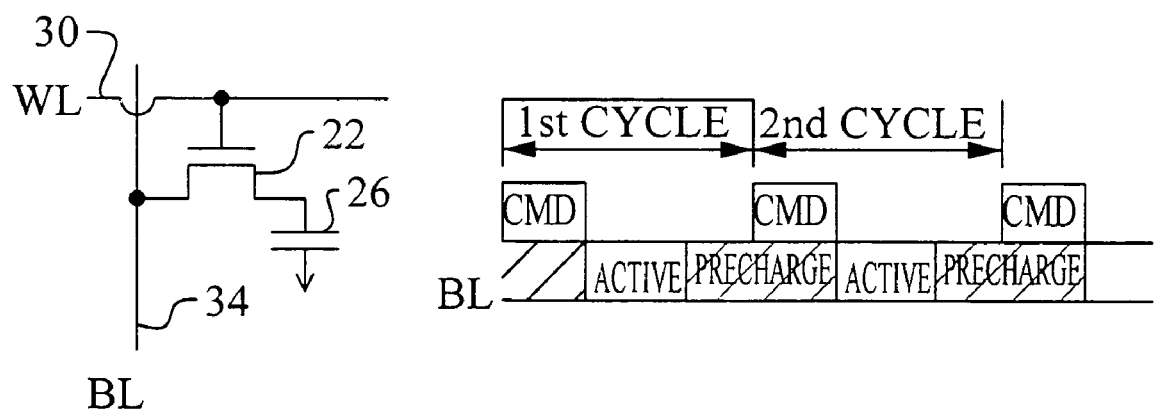
FIG. 2 illustrates a prior art DRAM cell showing access timing.
Figure 3:
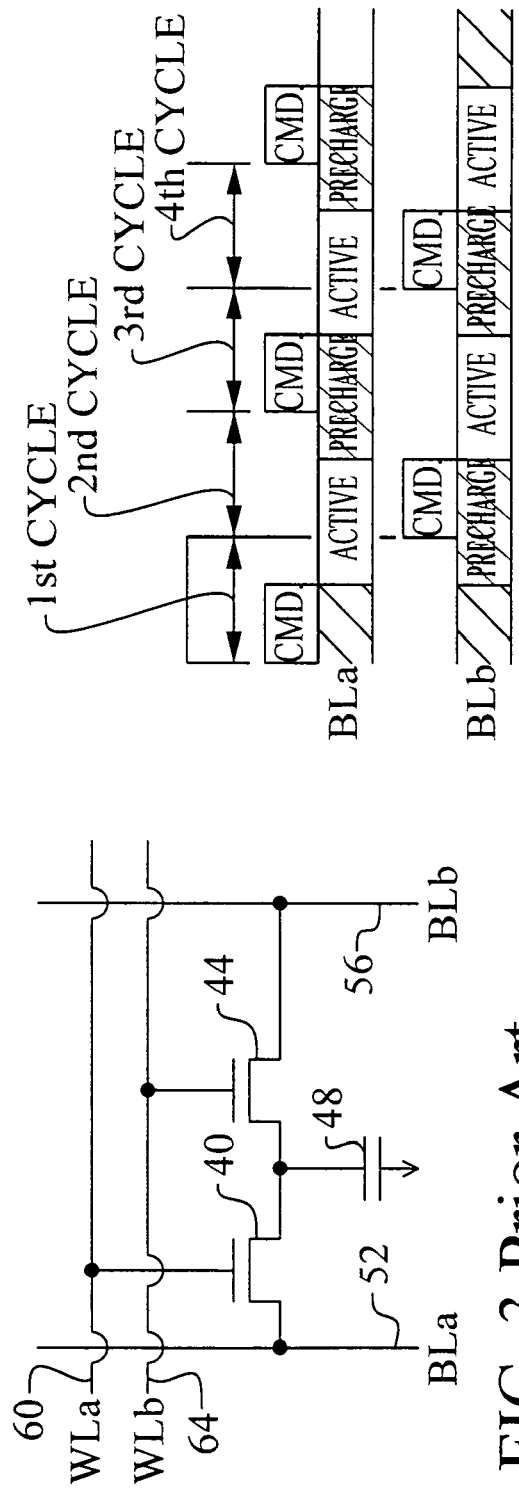
FIG. 3 illustrates a prior art dual port, DRAM cell showing access timing.
Figure 4:
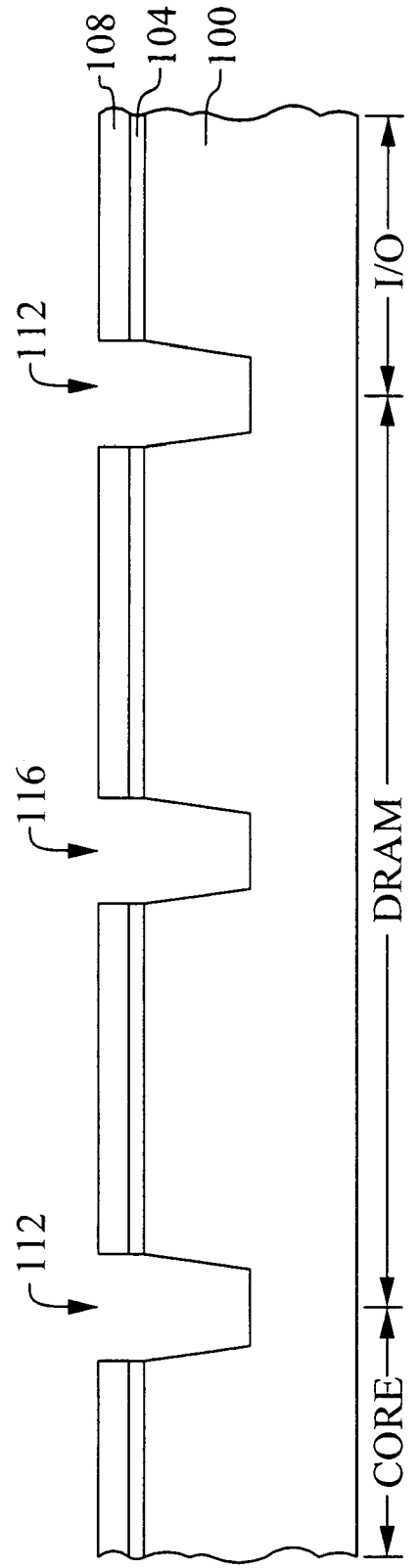

Referring now to FIGS. 4 through 19, the preferred embodiment of the present invention is illustrated. Many important features of the present invention are shown and discussed below. The preferred embodiment discloses a method to form dual-port DRAM cells in a standard CMOS process. Referring again particularly to FIG. 4, a substrate 100 is provided. The substrate 100 preferably comprises a semiconductor material and, more preferably, comprises monocrystalline silicon. In a process sequence that is typical of widely practice CMOS technology, a pad oxide layer 104 is formed on the substrate wafer 100. Typically, this pad oxide layer 104 is formed by thermal oxidation of the substrate 100. Next, a nitride layer 108 is deposited overlying the pad oxide layer 104. The nitride layer 108 serves as a masking layer during the processes used for defining active areas and shallow trench isolation (STI) regions. The pad oxide layer 104 improves adherence between the nitride layer 108 and the substrate 100. Preferably, the nitride layer 108 comprises silicon nitride that is deposited using a chemical vapor deposition (CVD) process.

Trenches 112 and 116 are etched through the nitride layer 108, the pad oxide layer 104, and into the substrate 100. Typically, a photoresist layer, not shown, is deposited overlying the nitride layer 108. This photoresist layer is then exposed to actinic light through a reticle. After development, the remaining photoresist layer forms a mask which covers parts of the nitride layer 108 while exposing parts of the nitride layer 108. An etching process is then performed. The exposed nitride layer 108 is etched while the covered nitride layer 108 is not etched. After etching through the nitride layer 108, the pad oxide layer 104 is etched through where exposed by the nitride layer 108. Finally, the substrate 100 is etched where exposed by the nitride layer 108 and the pad oxide layer 104. For example, an anisotropic, dry etching process may be used. Following the etching process, or perhaps following the etching of the nitride layer 108, the remaining photoresist layer is stripped.

The above-described process forms a plurality of trenches 112 and 116 in the surface of substrate 100. In the present invention, the integrated circuit device comprises at least two types of areas: DRAM area and non-DRAM area. More preferably, the device comprises a CORE area, a DRAM area, and an I/O area. The CORE area comprises the area of the integrated circuit device where high density, small feature size, low operating voltage CMOS transistors are formed. In the DRAM area, the dual-port DRAM cells are formed. In the I/O area, the I/O pads and circuits coupled directly to the pads are formed. Generally, the I/O area comprises devices formed with larger feature sizes and higher operating voltages. The trenches 112 and 116 formed in the substrate 100 are typical of those formed for shallow trench isolation (STI) regions. As will be described below, the trenches 112 in the CORE and I/O areas will be used for STI regions, while the trenches 116 in the DRAM cell area will be used for storage capacitors. The simultaneous formation of this plurality of trenches 112 and 116, where some trenches 112 are used for STI regions and some trenches 116 are used dual-port DRAM capacitors, is a unique feature of the present invention.

Figure 5:
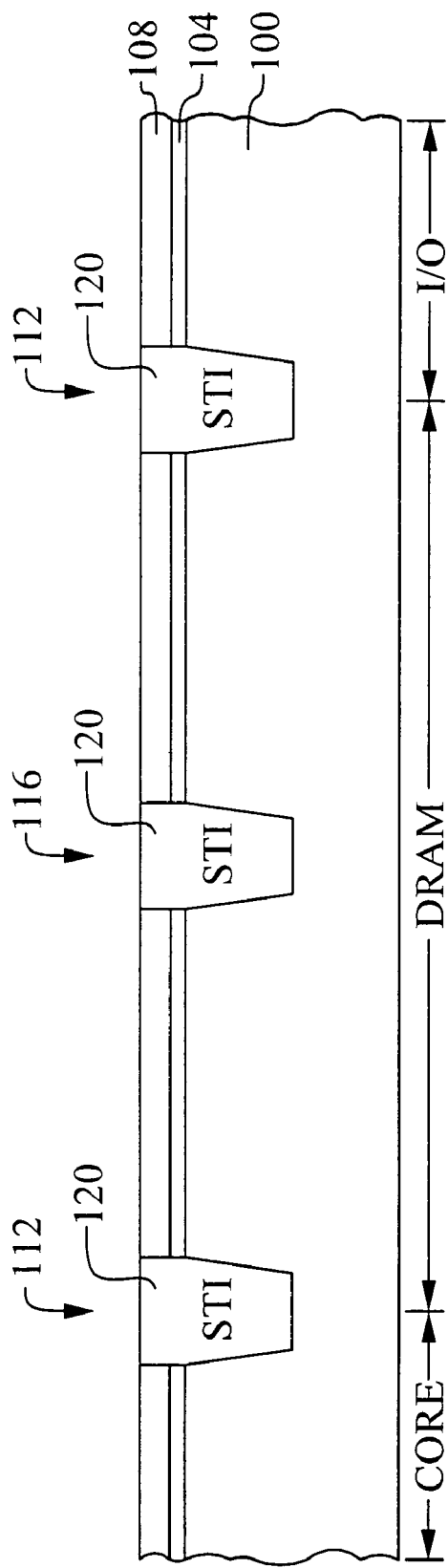

Referring now to FIG. 5, a first dielectric layer 120 is formed overlying the nitride layer 108 and filling the trenches 112 and 116. The first dielectric layer 120 preferably comprises silicon oxide that is deposited by CVD. The first dielectric layer 120 is then planarized to the top surface of the nitride layer 108 to form STI regions 120. Preferably, the planarization step comprises a chemical mechanical polish. Other planarization processes may be used. As an important feature, the nitride layer 108 is preferably not removed from the substrate 100 at this point.

Figure 6:
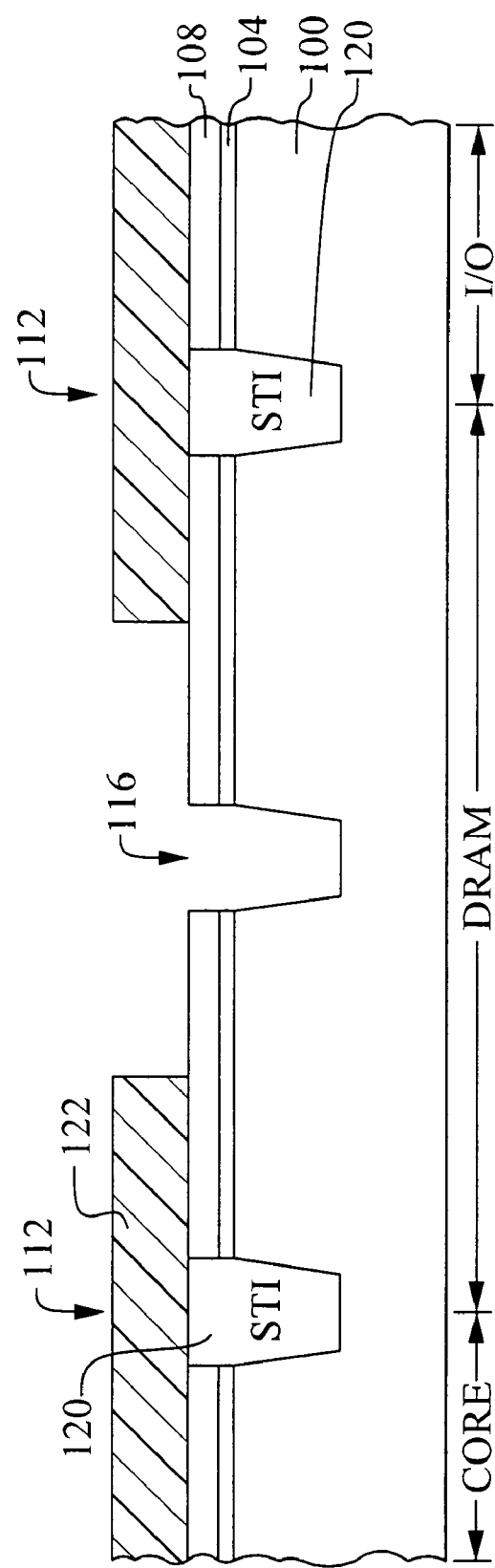

Referring now to FIG. 6, a particularly important feature of the present invention is illustrated. The first dielectric layer 120 is selectively etched away from the trenches 116 where dual-port DRAM capacitors are planned. Preferably, a crown mask layer 122 is first deposited overlying the nitride layer 108 and the STI regions 120. The crown mask layer 122 is then patterned to expose the STI regions 116 in the DRAM cell area where storage capacitors, or crown capacitors, are planned. The trench dielectric layer 120 is etched away where it is exposed by the crown mask 122. The presence of the nitride layer 108 reduces etching of the substrate 100 during the dielectric layer 120 etching step. This eliminates damage to the substrate 100 and results in a storage capacitor with low leakage current. The crown mask layer 122 preferably comprises a photoresist material that is patterned as described above.

Referring now to FIG. 7, important, but optional features of the present invention are disclosed. The crown masking layer 122 is removed. An ion implantation 124 may then be performed. An inert ion species is implanted 124 into the sidewalls of the open trenches 116 in the DRAM area. The inert ion species is defined as a species that is not a dopant (donor or acceptor) for the substrate 100. For example, nitrogen ($N_2$) may be implanted into the sidewalls of the trenches. The presence of the inert species in the substrate material 100 of the sidewalls is found to suppress the oxide growth rate of the sidewalls. Note that the silicon of the sidewalls of the trenches has a different crystal orientation than the crystal orientation of the bottom of the trenches or of the top surface of the wafer. For example, the wafer top surface and the bottom surface of the trenches may be oriented in the <100> direction while the sidewalls are oriented in either the <110> or the <111> direction. In this case, the sidewalls would exhibit a higher oxide growth rate than the horizontal surfaces. It is advantageous to keep the sidewall oxide growth rate as low, as or lower than, the growth rate of the horizontal surfaces. Implantion of the inert ion species will reduce the oxide growth rate on the sidewalls. During the subsequent process steps, the reduced oxide growth rate will enable a thinner oxide layer to be formed between the bottom plate and the top plate of the cell capacitor. This increases the unit capacitance of the completed cell capacitor. In addition, the inert ion implantation 124 will improve the uniformity of the oxide.

As a second option, ions may be implanted 125 into the substrate in the open trenches to optimize the threshold voltage of the cell plate. In this case, dopant ions, such as boron, phosphorous, or arsenic, are used to create a doped region 128 in the substrate 100. The nitride layer 108 forms a hard mask for either of the optional ion implantation steps 124 and 125. Note that both the inert implant 124 and the threshold implant 125 are performed without an additional masking step. Both implants 124 and 125 are self-aligned such that the implantation is selective to only the open trenches 116 in the DRAM area.

Referring now to FIG. 8, as an important step in the preferred embodiment, the nitride layer 108 and the pad oxide layer 104 are removed. Preferably, the nitride layer 108 and the pad oxide layer 104 are etched away. During the pad oxide layer 104 etch, a top layer of the trench dielectric layer 120 may be consumed. The substrate 100 is exposed.

Referring now to FIG. 9, ions may be implanted into the substrate 100 to form wells 136, 140, and 144. For example, n-type well regions (NW) may be formed in the substrate 100 where the substrate is p-type. Further, separate implants 132 may be performed to form wells 136, 140, and 144 having different concentrations or depths for the I/O, CORE, and DRAM areas, respectively. Typically, a masking layer is defined for each type of well that is implanted. In addition, a sacrificial oxide layer may be grown.

Referring now to FIG. 10, an important step in the preferred embodiment of the present invention is shown. A second dielectric layer will be formed overlying the substrate 100 and lining the open trenches 116. In the preferred embodiment, the second dielectric layer comprises three different thicknesses for the three device areas of CORE, DRAM, and I/O. It should be understood that the second dielectric layer could be formed to a single thickness. As a first step in the preferred embodiment, a first oxide layer 150 is formed overlying the substrate 100 and lining the open trenches 116 of the DRAM area. It is possible for the first oxide layer 150 to be used as the gate dielectric for the CORE CMOS, for the I/O CMOS, and for the dual-port DRAM transistors and cell capacitors. However, in the preferred embodiment, three different oxide thicknesses are formed for the CORE, I/O, and DRAM areas. Therefore, a method to form three oxide thicknesses is illustrated. This first oxide layer 150 preferably comprises silicon oxide that is grown by thermal oxidation. The first oxide layer preferably comprises a thickness of between about 45 Angstroms and about 70 Angstroms.

Figure 11:
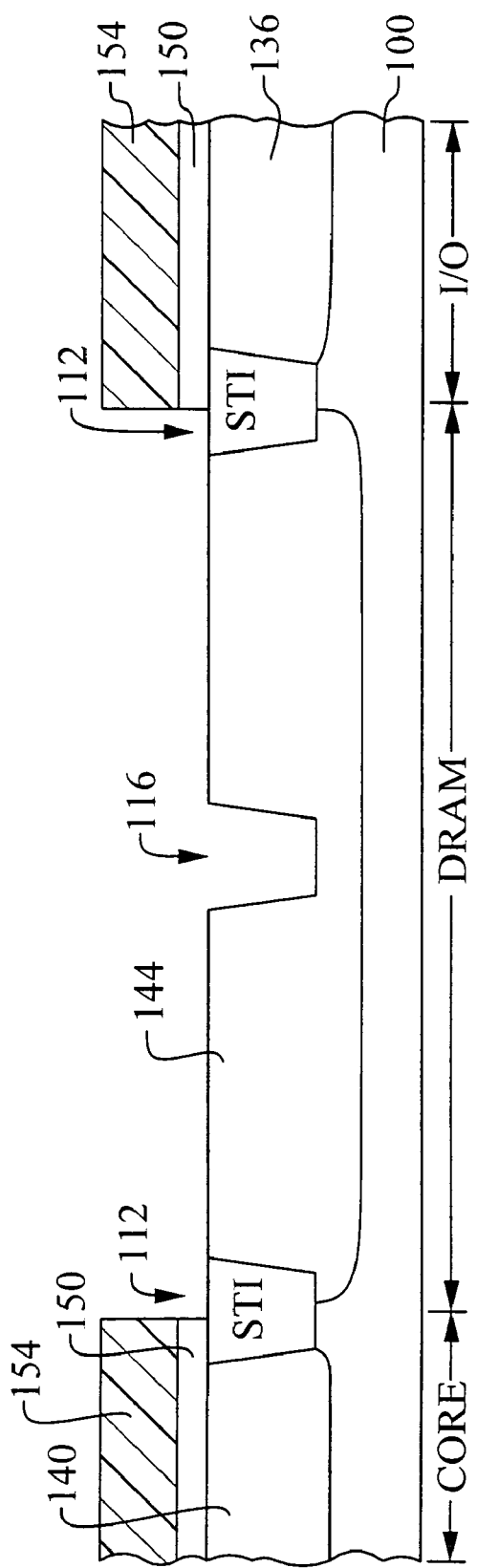

Referring now to FIG. 11, the first oxide layer 150 is selectively removed from the DRAM cell area. The first oxide layer 150 is etched away from the DRAM capacitor trenches 116 and the active area for forming the dual-port access transistors. A first oxide mask 154 is preferably formed such that the DRAM cell areas are exposed. The first oxide mask 154 may comprises a photoresist layer that is patterned as described above.

Figure 12:
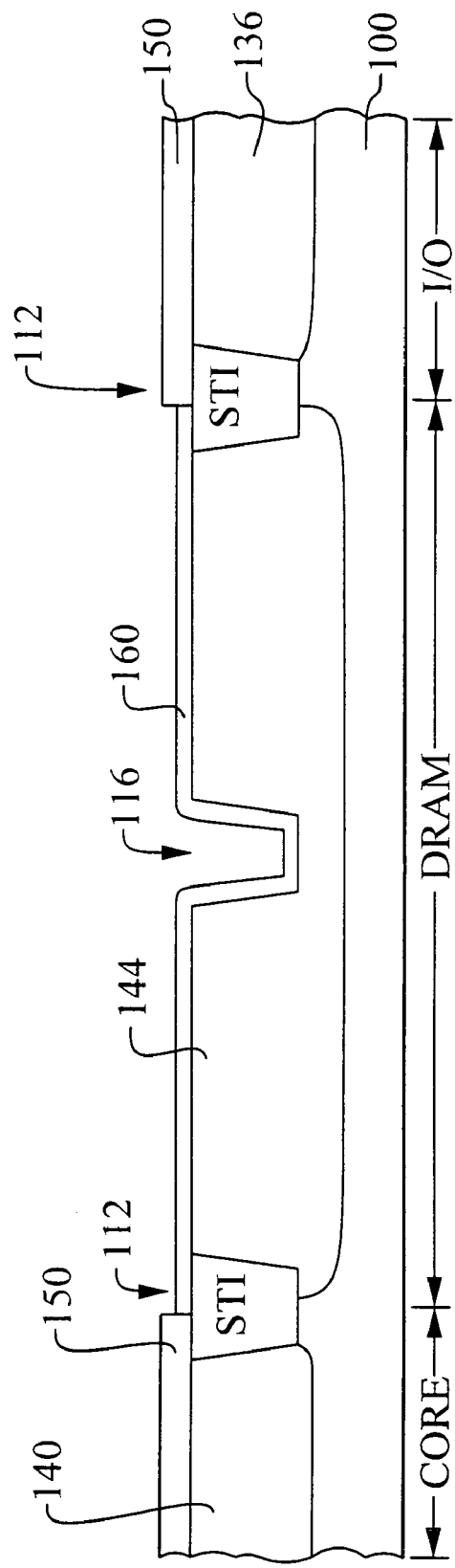

Referring now to FIG. 12, a second oxide layer 160 is now formed overlying the first oxide layer 150, the exposed substrate 100, and the open DRAM capacitor trenches. For simplicity of illustration, the second oxide layer 160 is included in the first oxide layer 150 for the CORE and I/O areas. It is understood that the oxide layer 150 overlying the CORE and I/O areas is made yet thicker during the oxide growth. Preferably, the second oxide layer 160 is formed by thermal oxidation to a thickness of between about 24 Angstroms and about 30 Angstroms.

Referring now to FIG. 13, the combined thickness of the second oxide layer 160 and the first oxide layer 150 is selectively removed from the CORE area. A second oxide mask 164 may be formed to allow for the selective etching away of the oxide from the CORE area substrate 100 surface.

Referring now to FIG. 14, a third oxide layer 170 is formed overlying the exposed substrate 100 and the second oxide layer 160. The third oxide layer 170 is preferably formed by thermal oxidation to a thickness of between about 16 Angstroms and about 24 Angstroms. The thickness of the third oxide layer 170 will be the thickness of the gate oxide 170 for the CMOS devices formed in the CORE area. The combined thickness of the second oxide layer 160 and additional growth during the third oxide layer oxidation will be the thickness of the gate oxide 160 for the DRAM cell devices. The combined thickness of the first oxide layer 150 and additional growth during the second and third oxide layer oxidation will be the thickness of the gate oxide layer 150 for the I/O devices. As can be seen, the preferred method of the present invention allows three optimal oxide thicknesses to be formed. Typically, the CORE oxide 170 will be the thinnest, the I/O oxide 150 will be the thickest, and the DRAM oxide 160 will be a mid-range thickness. This approach will facilitate the formation of high speed CORE transistors, moderate speed/low leakage DRAM devices, and high voltage I/O transistors. Alternatively, the method could be easily altered to produce two or only one oxide thickness over the areas by eliminating masking and etching steps. In the preferred embodiment, the second dielectric layer 150, 160, and 170 comprises silicon oxide. Alternative dielectric materials, such as metal oxides or nitride-based materials, may be used.

Referring now to FIG. 15, an important feature of the present invention is illustrated. A conductive layer 180 is deposited overlying the first, second, and third oxide layers 150, 160, and 170, also known as the second dielectric layer 150, 160, and 170. The conductive layer 180 preferably comprises polysilicon and, more preferably, comprises doped polysilicon. Other materials, such as metal materials, may be used. A polysilicon layer 180 is preferably deposited by CVD to a thickness of between about 1,500 Angstroms and about 2,500 Angstroms.

Referring now to FIG. 16, the conductive layer 180 is patterned to form gates 210 of MOS devices in the CORE region, to form gates 214 of MOS devices in the I/O region, to form gates 200 and 204 of access transistors in the DRAM region, and to form top plates 190 of cell capacitors in the DRAM region. A gate masking layer 184 is used to selectively etch the conductive layer 180. For example, a photoresist layer 184 is deposited overlying the conductive layer 180. The photoresist layer 184 is patterned by the method described above. The exposed conductive layer 180 is then etched using, for example, a dry etch process as is well known in the art. The ability to form the MOS transistor gates 200, 204, 210, and 214, simultaneous with the DRAM capacitor top plates 190 is a key feature of the present invention and enables a simple integration of the DRAM cells into a CMOS device.

Figure 17:
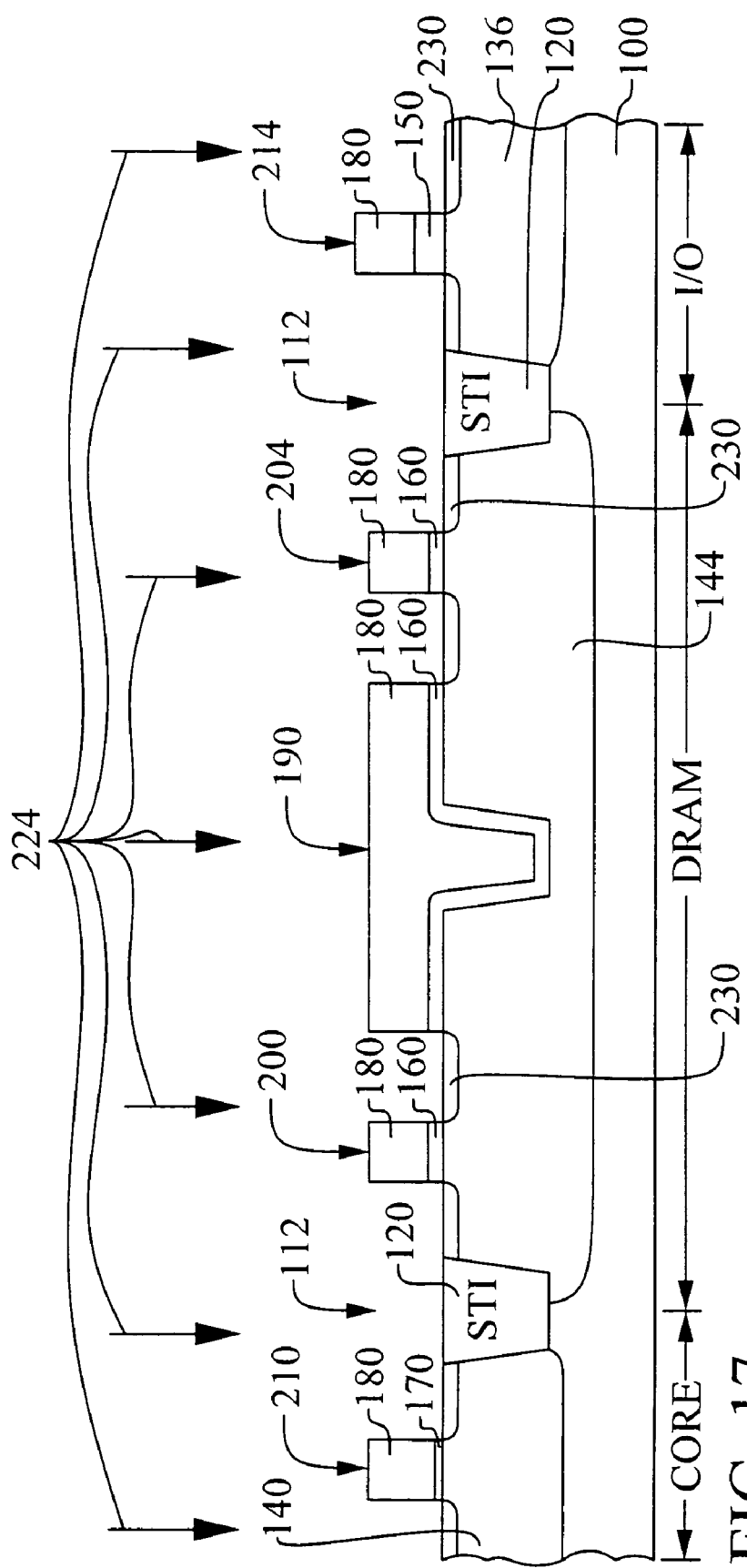

Referring now to FIG. 17, as an optional feature, ions are implanted 224 into the substrate 100 to form lightly doped drain (LDD) regions 230 self-aligned to the gates 200, 204, 210, and 214, and to the capacitor top plates 190. The formation of LDD regions 230 self-aligned to MOS gates is a well-known method to reduce short channel effects in MOS devices.

Figure 18:
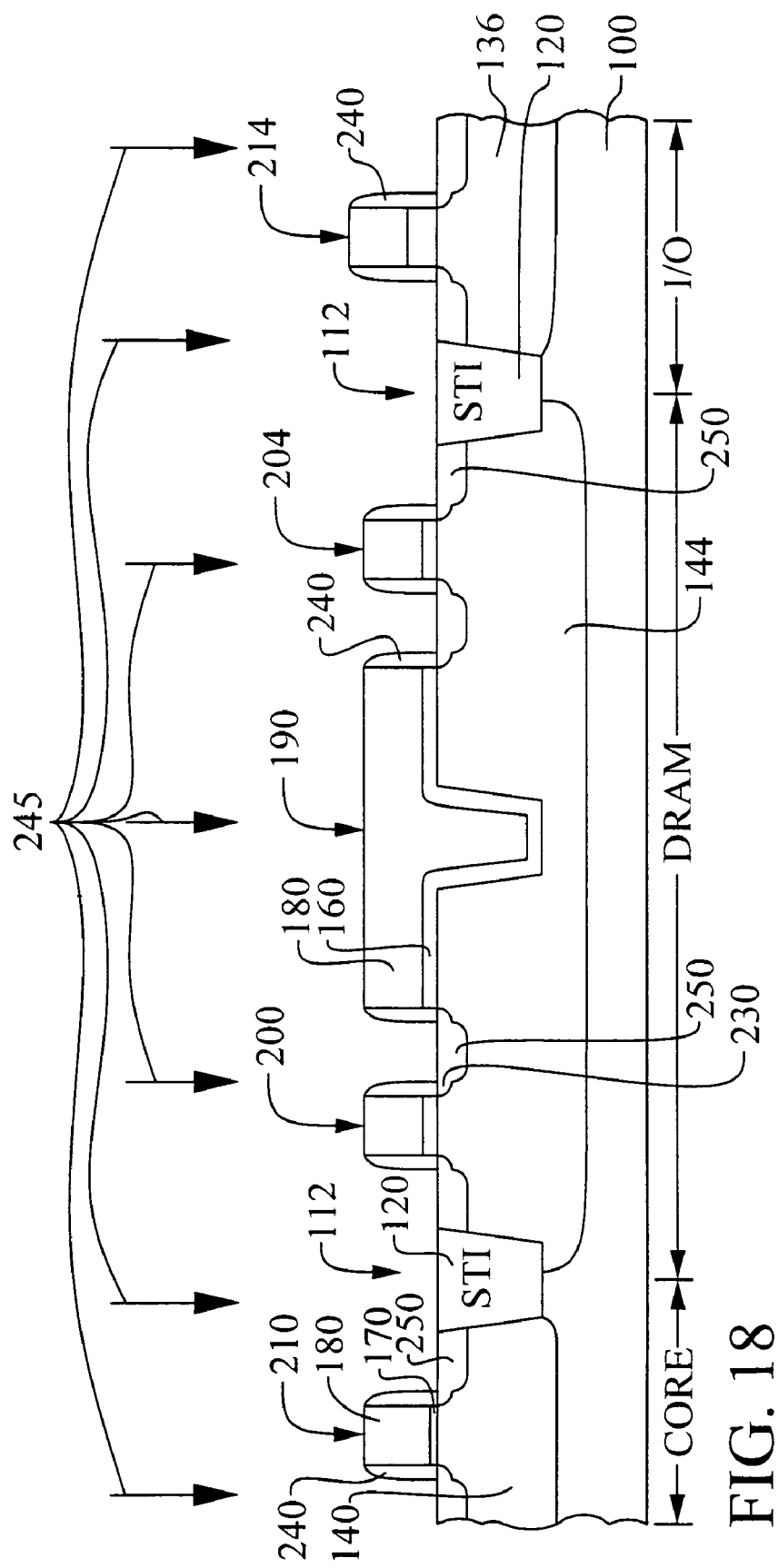

Referring now to FIG. 18, ions are implanted 245 into the substrate 100 to form source regions 250*b* and drain regions 250*a* for the MOS transistors 200, 204, 210, and 214. In the preferred embodiment, spacers 240 are first formed on the sidewalls of the conductive layer 180. The spacers 240 comprise a dielectric material that is deposited and then anisotropically etched back. Typically, the source regions 250*b* and drain regions 250*a* are deeper and more heavily doped that the LDD regions 230.

Figure 19:
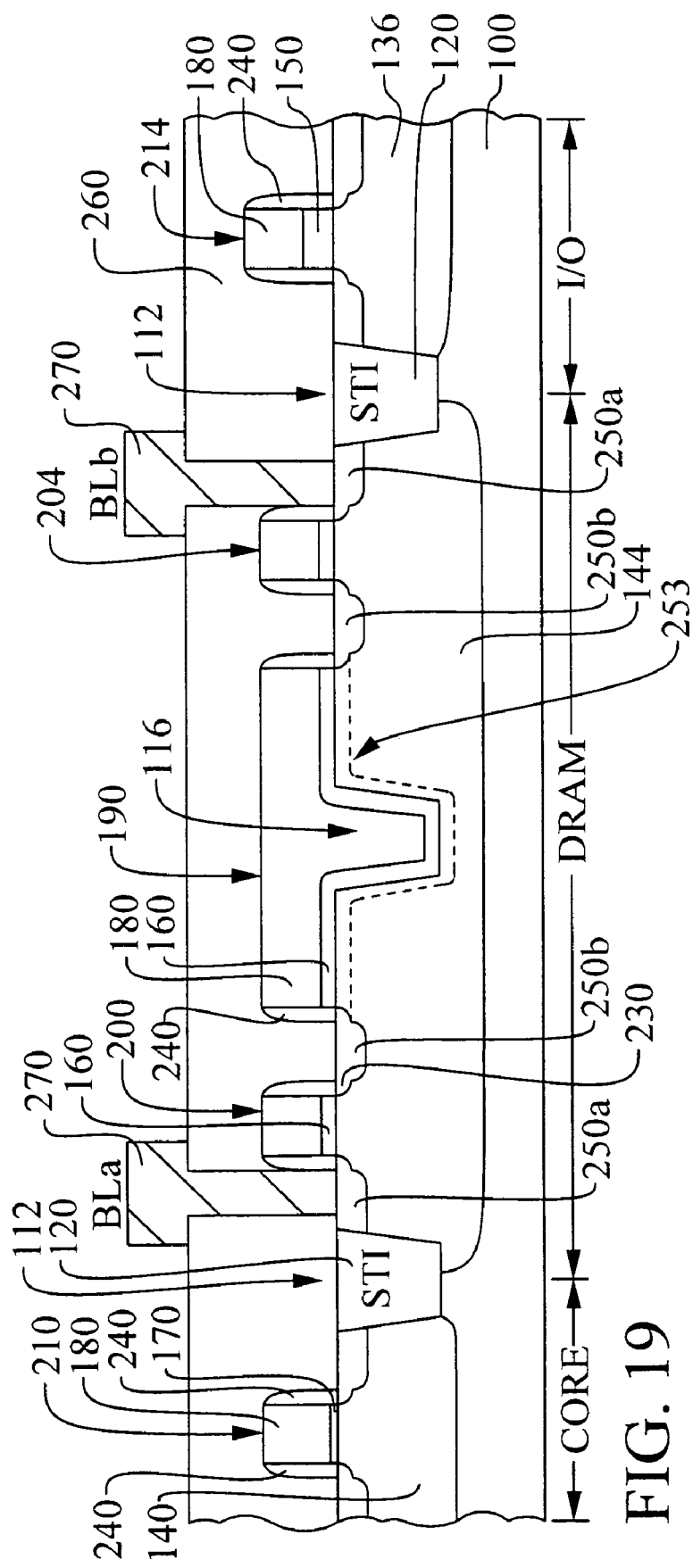

Referring now to FIG. 19, an interlevel dielectric layer 260 is deposited overlying the MOS gates 210, 214, 200, and 204, the capacitor top plates 190, and the substrate 100. The interlevel dielectric layer 260 is then patterned to form contact openings to the underlying drain regions 250 and to the conductive layer 180. A metal layer 270 is deposited overlying the interlevel dielectric layer 260 and filling the contact openings. The metal layer 270 is patterned to form connective lines. The drains 250 of the access transistors 200 and 204 are coupled to bit line signals such as BLa and BLb. Note that the source side regions 250*b* will connect to a plate inversion layer 253 that is formed when the top plate 180 is biased. In this way, the bottom plate of the capacitor is coupled to the source regions 250*b* without a contact opening or metal routing.

The completed integrated circuit may now be described. The device comprises a plurality of MOS devices 210 and 214. A plurality of STI regions 120 in a substrate 100 separates the MOS devices 210 and 214. An array of DRAM cells each comprises a capacitor 190 comprising a trench 116 in the substrate 100. The trench 116 is lined by a second dielectric layer 160. The trench 116 is filled by a conductive layer 180 overlying the oxide layer 160. The trench 116 is etched at the same time as trenches 112 for the STI regions 120. Access transistors 200 and 204 having gate 180, drain 250, and source 250 terminals are included. The gate terminals 200 and 204 comprise the conductive layer 180.

The advantages of the present invention may now be summarized. An effective and very manufacturable method to form dual-port DRAM in an integrated circuit device is achieved. The method to form dual-port DRAM in a standard CMOS process requires minimal changes to that process. The dual-port DRAM cells have minimal cell area and optimal access speed. The method to form dual-port DRAM uses available shallow trench isolation (STI) trenches to form trench capacitors. A dual-port DRAM cell having a small layout area and excellent performance is achieved. Dual-port DRAM capability in a system on chip (SOC) integrated circuit device is achieved.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:
    a plurality of MOS devices wherein a plurality of STI regions in a substrate separate said MOS devices; and
    an array of DRAM cells each comprising:
        a capacitor comprising a trench in said substrate wherein said trench is lined by a dielectric layer, wherein said trench is filled by a conductive layer overlying said dielectric layer, and wherein said trench is etched at the same time as trenches for said STI regions; and
        access transistors having gate, drain, and source terminals wherein said gate terminals comprise said conductive layer;
    wherein said substrate comprises a core area, an I/O area, and a DRAM area, each of said core area, said I/O area, and said DRAM area has a gate oxide layer, and said gate oxide layer comprises a different thickness for each of said areas.

2. The device according to claim 1 further comprising inert ions in said trench.

3. The device according to claim 1 wherein said inert ions comprise nitrogen.

4. The device according to claim 1 further comprising dopant ions in said trench.

5. The device according to claim 1 further comprising well regions underlying said DRAM cells.

6. The device according to claim 1 further comprising:
    lightly doped source and drain regions for said transistors; and
    spacers on sidewalls of said transistor gate terminals.

7. The device according to claim 1 wherein said dielectric layer comprises silicon oxide.

8. The device according to claim 1 wherein said conductive layer comprises polysilicon.

9. The device according to claim 1, wherein said drain terminals of said access transistors in each DRAM cell are coupled to bit lines, and said source terminals are coupled to a plate inversion layer under said dielectric layer.

* * * * *